(12) United States Patent
Riet

(10) Patent No.: US 6,181,573 B1
(45) Date of Patent: Jan. 30, 2001

(54) TWO-PART ELECTROMAGNETIC RADIATION SHIELDING DEVICE FOR MOUNTING ON A PRINTED CIRCUIT BOARD

(75) Inventor: Johan Te Riet, Hengelo (NL)

(73) Assignee: Telefonaktiebolaget LM Ericsson (publ), Stockholm (SE)

(*) Notice: Under 35 U.S.C. 154(b), the term of this patent shall be extended for 0 days.

(21) Appl. No.: 09/040,385

(22) Filed: Mar. 18, 1998

(30) Foreign Application Priority Data

Mar. 19, 1997 (EP) .................................................. 97200822

(51) Int. Cl.[7] ...................................................... H05K 9/00
(52) U.S. Cl. ........................ 361/816; 361/800; 174/35 R; 206/719
(58) Field of Search ................................... 361/736, 748, 361/752, 753, 796, 799, 800, 816, 818; 439/92, 95, 108, 607; 174/35 R, 35 GC, 50, 51; 206/719

(56) References Cited

U.S. PATENT DOCUMENTS

| | | | |
|---|---|---|---|
| 4,754,101 | * 6/1988 | Stickney et al. | 174/35 R |
| 5,095,177 | * 3/1992 | Johnson | 361/818 X |
| 5,099,396 | * 3/1992 | Barz et al. | 361/818 X |
| 5,175,395 | * 12/1992 | Moore | 174/35 R |
| 5,339,222 | 8/1994 | Simmons et al. | 361/818 |
| 5,354,951 | * 10/1994 | Lange, Sr. et al. | 361/818 X |
| 5,495,399 | 2/1996 | Gore et al. | 361/814 |

FOREIGN PATENT DOCUMENTS

| | | |
|---|---|---|
| 9400526U | 3/1994 | (DE) . |
| 2285181 | 6/1995 | (GB) . |

* cited by examiner

Primary Examiner—Jayprakash N. Gandhi
(74) Attorney, Agent, or Firm—Burns, Doane, Swecker & Mathis, L.L.P.

(57) ABSTRACT

A two-part electromagnetic radiation shielding device (10) for mounting on a Printed Circuit Board (PCB). The device (10) comprises a substantially open frame member (6) for receiving an electric or electronic component requiring shielding, and a closing can or cover member (1). The frame and cover members (6; 1) are constructed from electrically conductive material and have peripheral sides (7; 3) adapted to grip each other such that, in use, the frame and cover member (6; 1) surround the component in a closing arrangement. The peripheral sides (7; 3) of the frame and cover member (6; 1) have a shape such that a continuous gripping force is exerted (14) to establish and maintain circumferential electrical contact (13) between the frame and cover member (6; 1) at facing edges (5; 11) of the peripheral sides (3; 7) of the members (1; 6). Separate mechanical (14) and electrical (13) engagements are provided for optimum Electro Magnetic Compatibility (EMC) shielding.

6 Claims, 3 Drawing Sheets

TWO-PART ELECTROMAGNETIC RADIATION SHIELDING DEVICE FOR MOUNTING ON A PRINTED CIRCUIT BOARD

FIELD OF THE INVENTION

The present invention relates to shielding of electromagnetic radiation and, more particularly, to a device for shielding electric or electronic components on a Printed Circuit Board (PCB).

BACKGROUND OF THE INVENTION

In present telecommunication systems, in particular systems for cellular and cordless radio telecommunications, transceivers operating at frequencies in the GHz Radio Frequency (RF) band are used.

It is known that electric or electronic components or apparatuses and devices in the vicinity of electromagnetic radiation sources can be driven into malfunctioning if subjected to certain levels of electromagnetic radiation.

To avoid as much as possible any unwanted influence of electromagnetic radiation from devices such as oscillators in transceivers for telecommunication or other devices operating in the RF band, it is known to shield such radiation sources by encasing the radiation source or the device such as a transceiver incorporating the radiation source in a suitable housing. Such a housing is usually formed of conductive materials having an ability to concentrate high levels of magnetic flux. Accordingly, the electromagnetic radiation is prevented from leaving the housing.

On the other hand, it is also possible to encase an electric or electronic component which is sensitive to electromagnetic fields, such to prevent that any magnetic, electric or electromagnetic fields can reach the component through its encasing. Housings for shielding electromagnetic radiation are also known as Faraday cages.

U.S. Pat. No. 5,339,222 discloses a two-part electromagnetic radiation shielding housing for receiving a complete PCB.

GB-A-2,285,181 discloses a two-part shielding device for mounting at a PCB such that in use, a component requiring shielding is completely surrounded and enclosed by the shielding device and a signal ground layer of the PCB to which the device is electrically connected. The component can be either an electromagnetic radiation source or a component which is vulnerable to electromagnetic fields.

With the present trend towards using frequencies in the GHz range and due to increasing governmental regulations on electromagnetic stray field levels of devices such as mobile or cordless telephones and (small) base stations for indoor use, the presently available shielding devices are not suitable to meet future demanding ElectroMagnetic Compatibility (EMC) requirements.

SUMMARY OF THE INVENTION

The present invention has for its object to provide an improved electromagnetic radiation shielding device for use with a PCB providing an effective shielding for frequencies up to and above the GHz RF range.

It is a further object of the present invention to provide an electromagnetic radiation shielding device for mounting on a PCB and receiving a component or a number of components requiring shielding and mounted on the PCB.

It is a still further object of the present invention to provide an electromagnetic radiation shielding device which can be manufactured from one piece of sheet metal by common manufacturing techniques such as folding and drawing.

These and other objects and advantages of the present invention are provided by a two-part electromagnetic radiation shielding device for mounting on a Printed Circuit Board (PCB), comprising a substantially open frame member for receiving an electric or electronic component requiring shielding and a closing can or cover member. The frame and cover members are constructed from electrically conductive material and have peripheral sides adapted to grip each other such that, in use, the frame and cover members surround the component mounted on the PCB in a closing arrangement. Following the invention, the peripheral sides of the frame and cover member have a shape such that, in use, a continuous gripping force is exerted to establish and maintain circumferential electrical contact between the frame and cover member at facing edges of the peripheral sides of the members.

With the design of the present invention separate mechanical and electrical contact engagements of the frame and cover members are obtained, such that both can be optimised for its own purpose.

That is, under a continuous mutual mechanical force exerted by the design of the frame and cover part according to the invention, an electrical contact zone over the complete circumference of the frame and cover member is established to maximize its EMC performance. This contact zone is free from any holes or gaps arising from design purposes. Warping of any or both of the frame and cover members is compensated and flattened out by the mechanical force provided.

In the design according to the present invention, the electrical contact between the frame and cover members is primarily provided by the facing edges of the members and secondary by the mechanical contact of the peripheral sides for keeping the members engaged.

This, different from the shielding device disclosed by GB-A-2,285,181 wherein the mechanical and electrical contact points are the same and provided by resilient spaced apart fingers of the cover member which, in use, engage flat peripheral sides of the frame member. Through the openings between the fingers electromagnetic radiation, in particular at frequencies in the GHz RF frequency band, can leak from a radiation source enclosed by the device towards its outside or from the outside of the device towards the component enclosed. Although a secondary electrical contact will be established between the flat top of the cover and inwardly extending flanges of the frame member, this electrical contact is subject to loosening of the engagement of the frame and cover member due to mechanical shocks and warping of the cover, such that a complete circumferential electrical contact is not guaranteed.

With the present invention, a continuous force is exerted to maintain the circumferential electrical contact between the facing edges of the frame and cover members independent of mechanical shocks or warping of one or both of the members. In a preferred embodiment of the device according to the invention, the facing edges of the members comprise contact flanges extending transverse to the engaging peripheral sides. This to reduce as much as possible interruptions in the electrical contact due to small mechanical irregularities from burrs, notches and scratches. In order to achieve an optimum shielding effect, it is preferred to have these flanges, and in general the facing edges, formed as a closed contour from one piece of material, such that, in use, an essentially uninterrupted circumferential electrical contact between the facing edges is established and maintained.

For an optimum shielding effect, it is further preferred to have the electrical contact as close a possible near the PCB. To this end, in an embodiment of the device according to the invention, the facing edges are provided by edges of the frame member of its peripheral sides which, in use, are near the PCB and by the free edges of the peripheral sides of the cover member. Such that, in use, the electrical contact between the facing edges is provided near the PCB. In a preferred embodiment of the invention, the frame member is arranged to receive the cover member.

In another preferred embodiment of the shielding device of the invention, the peripheral sides of one of the members comprise a bevelled step and the peripheral sides of the other member comprise a resilient portion, such that in use the bevelled step and resilient portion engage each other thereby forcing the members in a closing arrangement.

That is, the step and the resilient portion are shaped such that, in use, the resilient portion by its engagement of the bevelled step exerts a force in a direction of closing the members, such to provide and maintain a force contact between the facing edges of the members.

To facilitate the mounting of the frame and cover member, the resilient portion may take the form of a shallow V, such that in use the V portion engages the bevelled step.

Due to the separation of the mechanical and electrical contact of the frame and cover member, the resilient portion can be provided by resilient spaced apart fingers, extending at the peripheral sides of a respective member, without a risk of RF leakage through the spaces between the fingers.

In a preferred embodiment of the invention, at edges of its peripheral sides opposite the PCB, the frame member is arranged for Surface Mounting (SM) at the PCB. For optimum shielding, it is preferred to provide the frame member at its complete circumference with means for SM, for example by providing a circumferential flange which can be SM soldered to a signal ground layer of the PCB.

The device according to the invention can be advantageously formed from one piece of electrically conductive sheet metal. Preferably, the frame member is formed by folding and the cover member is formed by drawing from sheet metal.

The above-mentioned and other features and advantages of the invention are illustrated in the following description with reference to the enclosed drawings.

DETAILED DESCRIPTION OF THE EMBODIMENT

Without the intention of a limitation, the invention will now be described and illustrated with the reference to a preferred embodiment.

Figure 1:
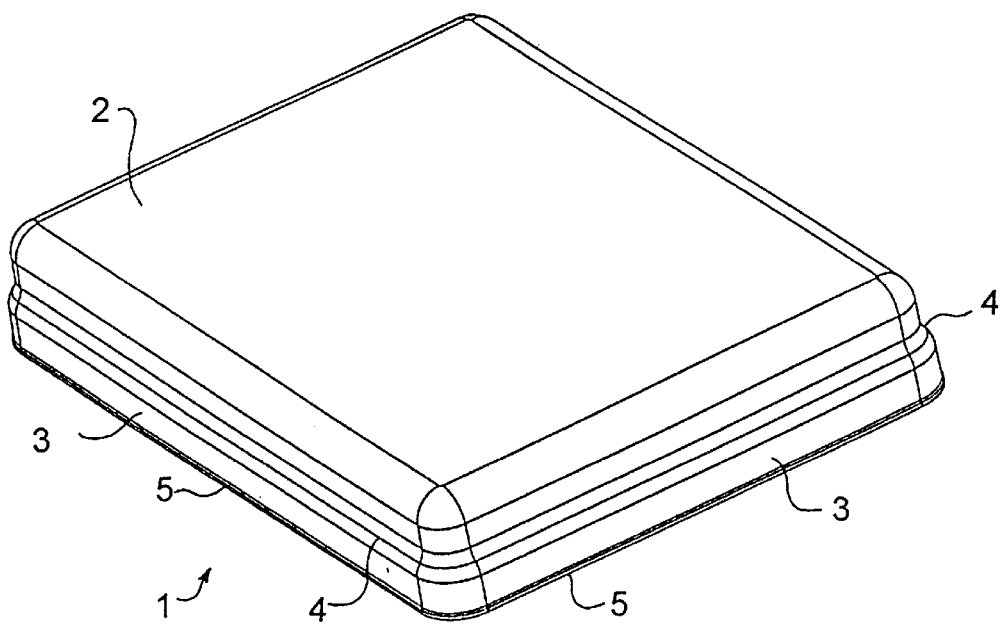
FIG. 1 is a schematic, perspective view of a preferred embodiment of a cover member of the shielding device according to the invention.

FIG. 1 shows, in perspective, a can or cover member 1 according to the invention, having a closed, solid top side 2 and closed, solid peripheral sides 3 which connect to the top side 2. The peripheral sides 3 are provided with a bevelled step 4, such that part of the cover member 1 between its top side 2 and the bevelled step 4 has smaller dimensions than part of the cover member 1 connecting to the bevelled step 4 and free edges 5 of the peripheral sides 3.

Figure 2:
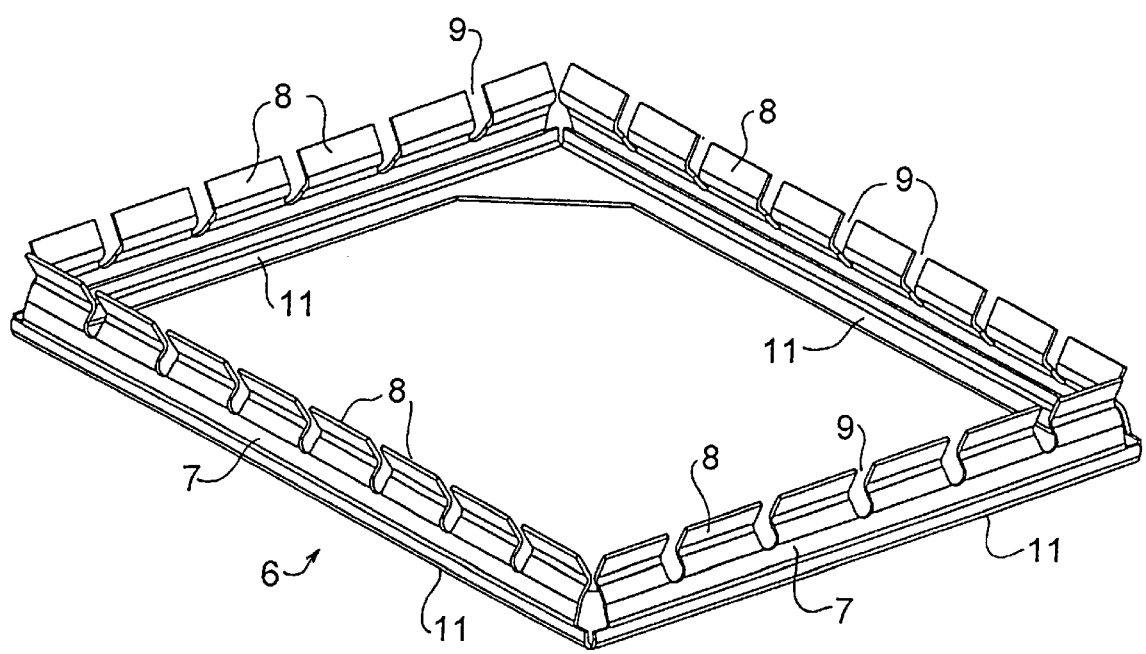
FIG. 2 is a schematic, perspective view of a preferred embodiment of a frame member of the shielding device according to the invention.

FIG. 2 shows a preferred embodiment of a substantially open frame member 6 according to the invention, having peripheral sides 7 from which spaced apart resilient fingers 8 extend. The resilient fingers 8 are separated by slits 9 and take the form of a shallow V, the opening portion of which facing the exterior of the frame member 6, as shown.

Figure 3:
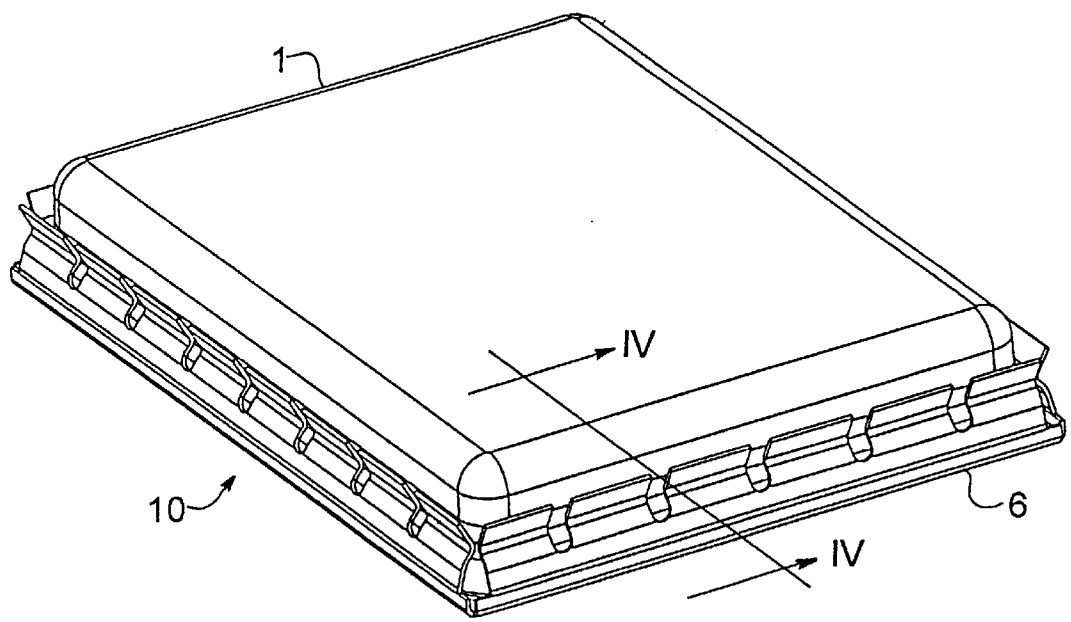
FIG. 3 is a schematic, perspective view of the mounted cover member and frame member according to FIG. 1 and FIG. 2.

FIG. 3 shows the cover member 1 and the frame member 6 in an engaged, closing arrangement, wherein the cover member 1 is received by the frame member 6 and such that the resilient fingers 8 exert a gripping force on the cover member 1 at its peripheral sides 3 at their bevelled step 4.

Figure 4:
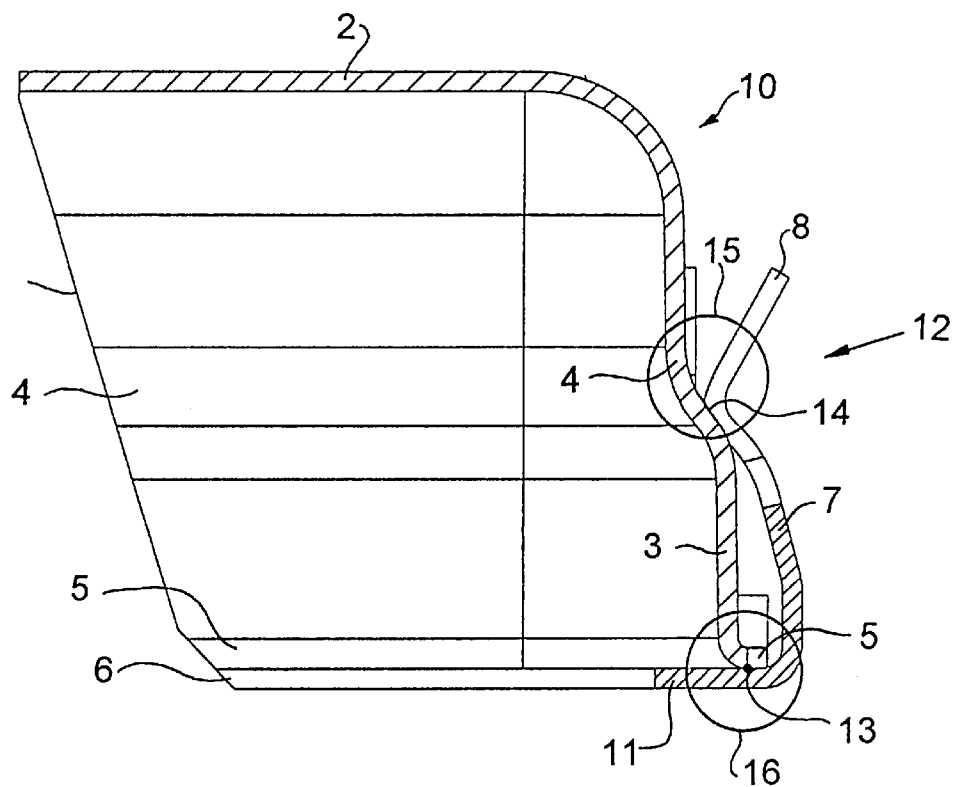
FIG. 4 is a cross-section through part of the mounted shielding device according to FIG. 3 along the line IV—IV, on an enlarged scale, showing the electrical and mechanical contact of the cover member and frame member.

FIG. 4 shows, on an enlarged scale, a cross section along the line IV—IV in FIG. 3. For illustrative purposes, the mechanical and electrical contact or engagement points are indicated by circles 15 and 16, respectively.

The finger 5 is resilient in the direction indicated by arrow 12. As can be seen in FIG. 4, the resilient finger 8 engages 14 the cover member 1 at its bevelled step 4, such that the cover member 1 is forced in a closing arrangement with the frame member 6. That is, downwards in the plane of the drawing.

Due to this continuous gripping force exerted by the frame member 6 on the cover member 1, the free edges 5 of the cover member 1 and the edge 11 of the frame member 6 face each other such that an electrical contact is established between the facing edges 5 and 11 at the entire circumference of the device 10, as schematically indicated with dot 13.

Following the invention, the mechanical 14 and electrical 13 contact points are separated, such that each can be optimized for its purpose; i.e. providing a sufficient mechanical force for maintaining the cover member 1 and the frame member 6 in a closing arrangement and providing circumferential electrical contact between the members, such to prevent an electromagnetic field penetrating or leaving the shielding device, in order to meet Electro Magnetic Compatibility (EMC) requirements for frequencies up to and above the GHz RF range.

In the embodiment shown, warping of the cover member 1 will not affect the electrical contact 13 due to the mechanical closing force exerted on the cover member 1 by the resilient fingers 8.

For achieving an optimum as possible electrical contact between the facing edges 5 and 11 of the shielding device 10 of the invention, the free edges 5 and the edges 11 are provided as circumferential flanges, establishing a low resistance circumferential electrical contact with as many as possible contact points between the members 1, 6.

Figure 5:
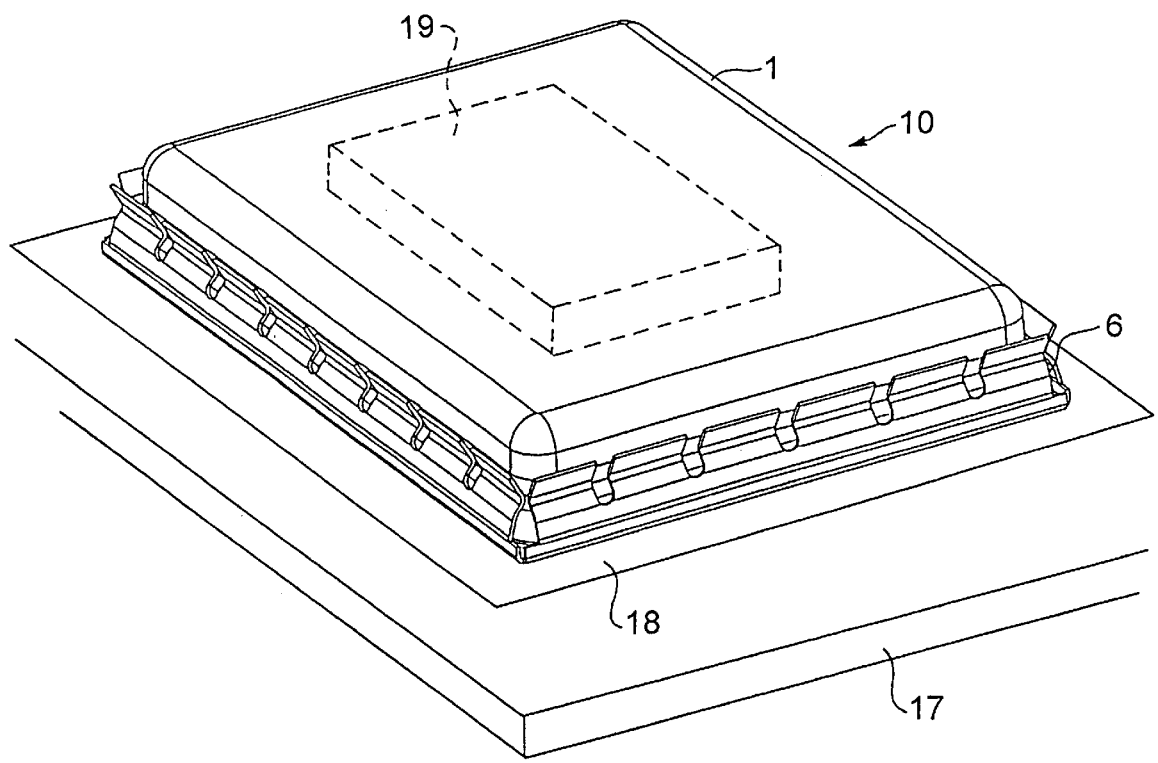
FIG. 5 is a schematic, perspective view of a shielding device shown in FIG. 3, mounted on a PCB and enclosing an electric on electronic component requiring shielding.

As shown in FIG. 2, the edges 11 of the frame member 6 are provided with a larger surface area at corners of the frame member 6, such to enhance its mechanical rigidity. The edges 11, i.e. there outwardly facing surface, serve also the purpose of fixing the frame member 6 by Surface Mounting (SM) soldering to a metal layer or wiring, such as the signal ground layer or signal ground wiring 18 of a Printed Circuit Board (PCB) 17 at which the frame member 6 is mounted. An electric or electronic component 19, for example an Application Specific Integrated Circuit (ASIC) as schematically illustrated by broken lines in FIG. 5, is completely enclosed by the shielding device 1 and the signal ground layer 18. Those skilled in the art of PCB design for RF purposes will appreciate that the signal layer 18 may also be one of the intermediate wiring layers of a multi layer PCB.

The cover member 1 and the frame member 6 can be formed from one piece of sheet metal, such as mu-metal by drawing and folding, respectively. Care has been taken to avoid sharp transitions at the facing edges 5, 11 near the electrical contact point 13.

The shielding device according to the invention is not prone to loosening of the electrical contact 13 by shocks and the like, due to the continuous mechanical force exerted by the resilient fingers 8 for keeping the cover member 1 and the frame member 6 in a closing arrangement.

Those skilled in the art will appreciate that, different from the preferred embodiment shown, the design of the peripheral sides of the cover member 1 and the frame member 6 can be interchanged. That is, the frame member 6 can be provided with closed sides comprising a bevelled step, whereas the peripheral sides of the cover member can be formed with resilient fingers 8 engaging the bevelled step of the frame member 6. In such case, the electrical contact is not established near the PCB but at the top side of the cover member. Further, it will be appreciated that the frame member 6 can be received by the cover member 1.

For optimum EMC performance, electrical contact 13 between the members 1, 6 near the PCB 17 is preferred. Instead of Surface Mount, the edges 11 of the frame member may also be designed for the well-known pin and hole soldering to the PCB 17, i.e. the wiring 18 thereof.

For the purpose of the invention, instead of resilient fingers 8 and a bevelled step 4, other designs providing a form closure for keeping the frame member and the cover member in a closing contact arrangement may be applied.

What is claimed is:

1. A two-part electromagnetic radiation shielding device for mounting on a Printed Circuit Board (PCB) and surrounding an electric or electronic component requiring shielding and mounted on said PCB, the device comprising a substantially open frame member and a closing can or cover member, said frame member and said can or cover member being constructed from electrically conductive material and having peripheral sides that grip each other in a closing arrangement, said peripheral sides of said frame member and said can or cover member being shaped such that said members exert a continuous gripping force on each other to establish and maintain uninterrupted circumferential electrical contact between said frame member and said can or cover member at facing edges of said peripheral sides of said members, wherein said peripheral sides of one member comprise a bevelled step and said peripheral sides of said other member comprise a reslient portion such that said bevelled step and resilient portion engage each other thereby forcing said members in a closing arrangement.

2. A device according to claim 1, wherein said reslient portion takes the form of a shallow V such that said V portion engages said bevelled step.

3. A device according to claim 1, wherein said resilient portion is formed as spaced apart resilient fingers extending from said peripheral sides of said member.

4. An electromagnetic radiation shielding device, comprising:
    an electrically conductive frame for receiving an electrical component;
    an electrically conductive cover for covering said frame, at least one of said frame and said cover having at least one member for contacting a first location of the other of said frame and said cover, said frame and said cover being configured to contact each other at a second location different than said first location, said second location being along an entire circumferential edge of at least one of said frame and said cover, said member biasing said other of said frame and said cover toward said second location, wherein said cover includes a beveled step, and said beveled step defines said first location.

5. A device according to claim 4, wherein said frame includes a plurality of said members, each of said members defining a flange.

6. A device according to claim 4, wherein said frame receives an electrical component, said cover covers said frame, said member contacts said first location, said frame and said cover contact each other at said second location, and said shielding device is mounted on a printed circuit board.

* * * * *